United States Patent
Wiltshire et al.

(10) Patent No.: US 6,768,051 B2
(45) Date of Patent: Jul. 27, 2004

(54) SCREENS FOR RF MAGNETIC FLUX

(75) Inventors: Michael Charles Keogh Wiltshire, Bucks (GB); Ian Robert Young, Marlborough (GB)

(73) Assignee: Marconi Optical Components Limited, London (GB)

(*) Notice: Subject to any disclaimer, the term of this patent is extended or adjusted under 35 U.S.C. 154(b) by 0 days.

(21) Appl. No.: 10/220,737

(22) PCT Filed: Mar. 6, 2001

(86) PCT No.: PCT/GB01/00968
§ 371 (c)(1),
(2), (4) Date: Jan. 28, 2003

(87) PCT Pub. No.: WO01/67553
PCT Pub. Date: Sep. 13, 2001

(65) Prior Publication Data
US 2003/0146802 A1 Aug. 7, 2003

(30) Foreign Application Priority Data
Mar. 6, 2000 (GB) .................................. 0005352

(51) Int. Cl.⁷ .................................................. H05K 9/00
(52) U.S. Cl. ................. 174/35 R; 343/909; 174/35 MS
(58) Field of Search ......................... 174/35 MS, 35 R; 361/816, 818; 343/701, 814, 815, 816, 909

(56) References Cited

U.S. PATENT DOCUMENTS

| | | | |
|---|---|---|---|
| 5,223,849 A | 6/1993 | Kasevich et al. | |
| 5,563,614 A | 10/1996 | Alden et al. | |
| 5,760,584 A | 6/1998 | Frederick | |

FOREIGN PATENT DOCUMENTS

| | | | | |
|---|---|---|---|---|
| GB | 234685 A | | 6/1925 | |
| JP | 03166809 A | * | 7/1991 | .......... H03H/7/075 |
| WO | 9950929 A | | 7/1999 | |
| WO | 0041270 A | | 7/2000 | |
| WO | WO 01/67126 A1 | | 9/2001 | |
| WO | WO 01/67549 A2 | | 9/2001 | |

OTHER PUBLICATIONS

Stevenpiper D. et al., "High–Impedance Electromagnetic Surfaces with a Forbidden Frequency Band", IEEE Transactions on Microwave Theory and Techniques, US IEEE Inc., New York, vol. 47, No. 11, Nov. 1999, pp. 2059–2074, XP0008651030.

Pendry et al., "Magnetism from Conductors and Enhanced Nonlinear Phenomena", vol. 47, No. 11, Nov. 1999, pp. 2075–2084.

* cited by examiner

Primary Examiner—Dean A. Reichard
Assistant Examiner—Carmelo Oliva
(74) Attorney, Agent, or Firm—Venable LLP; Catherine M. Voorhees

(57) ABSTRACT

Microstructured materials which can be tuned to a particular range of r.f. frequencies to display particular magnetic permeabilities have been proposed. A typical material is made of an array of capacitive elements e.g. spirals or rolls of conducting material on a non-conducting substrate. These materials can be used as screening material which is effective for the particular band of frequencies to which it is tuned. In one example, the rolls 2 to 5 are orientated normal to the face of the screen 1, which reflects or absorbs the magnetic vector of electromagnetic radiation impinging normal onto the reflector face.

11 Claims, 2 Drawing Sheets

SCREENS FOR RF MAGNETIC FLUX

BACKGROUND OF THE INVENTION

1) Field of the Invention

This invention relates to screens for r.f. magnetic flux.

2) Description of Related Art

Screening or shielding components from r.f. magnetic fields, and conversely preventing them from radiating r.f. energy, is generally done by encasing the components in a conductor. The conductor must be fully sealed, and have a thickness that greatly exceeds the skin depth at the relevant frequency. R.f. coils (for example, in r.f. communication systems, particularly at high powers and low frequencies) are generally shielded by enclosing them in a copper or aluminium can. The shield must completely enclose the component to be shielded, and all joints should be lapped or soldered. This approach tends to be costly, and often carries with it a weight penalty. In MRI (magnetic resonance imaging) systems, the entire apparatus is housed in a copper-clad room, with special precautions being taken to ensure that the door is fully shielded when closed, by providing copper contacts between the door and the frame, and a copper brush to contact the floor.

An alternative method of shielding is to enclose the region to be protected in a magnetic shell such as ferrite or mu-metal. This approach is clearly impossible for MRI and related applications, where there are strong DC or low frequency magnetic fields: the magnetic material would simply be attracted to the DC magnet with such force as to destroy the original magnetic shell.

Ferrites are also used as filters in many electronic systems that operate at high frequencies. For example, there are ferrite filters in PCs and monitors, to prevent the radiation of the clock frequency along interconnecting cables. In the MRI system, where ferrites are unacceptable, all the cabling that connects the machine to the outside world must have filters to suppress the r.f. These filters have to be constructed from either active or passive electronic circuits.

Microstructured materials have been proposed (IEEE Transactions on Microwave Theory and Techniques, 1999, 47, 2075–2084, Magnetism from Conductors and Enhanced Non-Linear Phenomena by J B Pendry, A J Holden, D J Robbins and W J Stewart, and International Patent Application WO 00/41270), in which the magnetic permeability depends on the frequency of oscillation of the magnetic field i.e. depends on the r.f. frequency.

Such materials comprise a structure with magnetic properties comprising an array of capacitive elements, the array exhibiting a predetermined magnetic permeability in response to incident electromagnetic radiation lying within a predetermined frequency band, wherein each element includes a low resistance conducting path and is such that a magnetic component of the electromagnetic radiation lying within the predetermined frequency band induces an electrical current to flow around said path and through said associated element, and wherein the size of the elements and their spacing apart are selected such as to provide a predetermined permeability in response to said received electromagnetic radiation. At least one dimension of each capacitive element is preferably less than the wavelength of the electromagnetic radiation. The capacitive elements may be in the form of conductive sheets wound as a spiral, or a plurality of stacked planar sections each of which is electrically isolated from each other and is in the form of a spiral.

The further preferred features of the materials are disclosed and claimed in International Patent Application WO 00/41270 and United Kingdom Patent Application No. 0005356.1, the contents of each of which are incorporated herein by reference.

Typically such materials consist of an array of capacitive elements at least one of whose dimensions is much smaller than the wavelength at which the desired permeability is exhibited, in which resonant interaction between the inductance of the structure and the capacitive elements causes electromagnetic energy to be shared between the magnetic fields and the electrostatic fields within the capacitive structure.

SUMMARY OF THE INVENTION

The invention provides a screen for r.f. magnetic flux, comprising an array of capacitive elements, the array exhibiting a predetermined magnetic permeability in response to incident electromagnetic radiation lying within a predetermined frequency band, wherein each capacitive element includes a low resistance conducting path and is such that a magnetic component of the electromagnetic radiation lying within the predetermined frequency band induces an electrical current to flow around said path and through said associated element, wherein the spacing of the elements is less than the wavelength of the radiation within the predetermined frequency band, and wherein the size of the elements and their spacing apart is selected such as to provide a magnetic permeability having a zero or negative real part to electromagnetic radiation in the predetermined frequency band.

The microstructured magnetic materials can be tuned to a required frequency, and constructed from readily-available materials which are both cheap and light. The material is non-magnetic in steady magnetic fields. The material may be attached to cables to prevent them radiating, reducing or obviating the need for filters, and may be draped around regions it is desired to shield.

Advantageously, the predetermined frequency band is within the HF band extending from 3 MHz to 30 MHz. Preferably, the predetermined frequency band is within the range extending from approximately 19 MHz to approximately 39 MHz.

The screen may form a planar structure. The capacitive elements may be rolls of conducting material arranged with their axes normal to the local surface of the planar structure. Alternatively, the planar structure is formed by a plurality of layers, each layer bearing an array of planar rings or spirals.

The spacing of the elements may be less than one half, preferably less than one fifth, of the wavelength of the radiation within the predetermined frequency band. Further advantages may flow from making the element spacing less than a tenth, or less than one hundredth of the wavelength of the radiation within the predetermined frequency band.

The invention also provides a method of designing a screen for magnetic r.f. flux, which comprises selecting the dimensions of capacitive elements arranged in an array, the array exhibiting a predetermined magnetic permeability in response to incident electromagnetic radiation lying within a predetermined frequency band, in which capacitive elements currents can be induced by the radio frequency electromagnetic radiation, and selecting the spacing apart of the capacitive elements to be less than the wavelength of the radiation within the predetermined frequency band, and the size and spacing of the elements in order to provide a magnetic permeability for the screen in response to the electromagnetic radiation within the predetermined frequency band which has a zero or negative real part.

BRIEF DESCRIPTION OF THE DRAWINGS

Screens for r.f. magnetic flux, and a method of designing such a screen, will now be described in detail, by way of example, with reference to the accompanying drawings, in which.

Like reference numerals have been given to like parts throughout all the drawings.

DETAILED DESCRIPTION OF THE INVENTION

The screen 1 is made of microstructured magnetic material as described in the IEEE paper, in International Patent Application WO 00/41270 and co-pending United Kingdom Patent Application No. 0005356.1.

Screening takes place when the real part of the magnetic permeability of the microstructured material is zero or negative, for there then exists no solutions to Maxwell's equations. This condition is met for a range of frequencies lying between the frequency at which the microstructured material has a magnetic permeability having a resonant variation which diverges at an angular frequency $\omega_O$ and a magnetic plasma frequency $\omega_P$ (FIG. 1) at which the magnetic permeability is equal to zero. This is explained with reference to FIG. 3 of International Patent Application WO 00/41270.

For negative real permeability, the imaginary component of the permeability could be any value, and for zero real permeability the imaginary component could be a high value.

Figure 2:
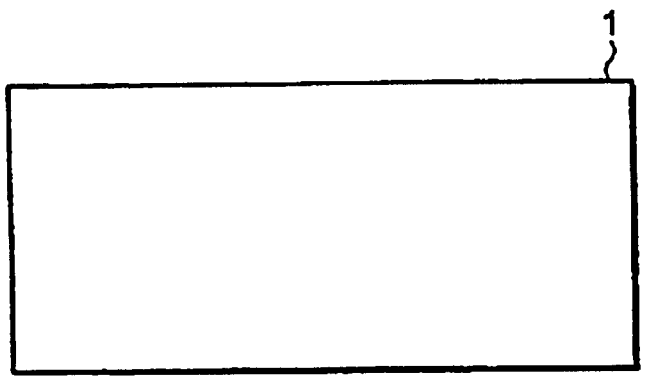
FIG. 2 is a front view of a screen.

The screen 1 of FIG. 2 consists of rolls, such as 2 to 5, of non-magnetic conductor on an insulating substrate. These extend from face to face of the screen i.e. normal to the surface of the screen, and are closely packed together in an array. The dimensions of the roll and their spacing is chosen to provide zero or negative real part of real permeability. Equally, the rolls, which form capacitive elements, could be formed by columns of planar elements, and both these constructions are described in International Patent Application WO 00/41270.

Figure 1:
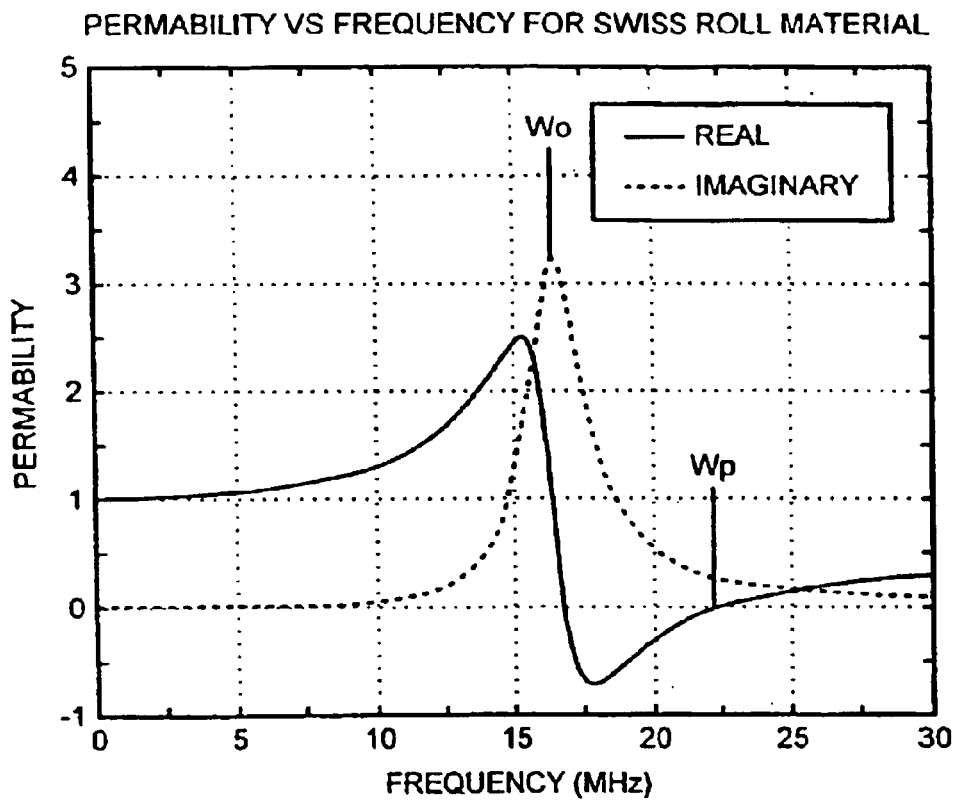
FIG. 1 is a graph showing the variation of the real and imaginary parts of the permeability of the screen, with frequency.

As described in the IEEE paper referred to, the permeability of the screen, which is shown in FIG. 1, is in the direction for magnetic flux propagating along the axes of the cylinders. That is, magnetic flux attempting to thread its way through the screen at right angles to the face thereof is subject to the array of rolls, and is subject to a zero permeability, in which case the electromagnetic radiation is absorbed, or negative permeability, in which case the electromagnetic radiation is reversed in direction i.e. reflected. This only applies over a narrow range of frequencies to which the microstructured material is tuned, and the screen behaves in a non-magnetic fashion in steady state magnetic fields.

The magnetic permeability of the screen in the plane of the screen may be unity, that is, the magnetic permeability of free space.

Figure 5:
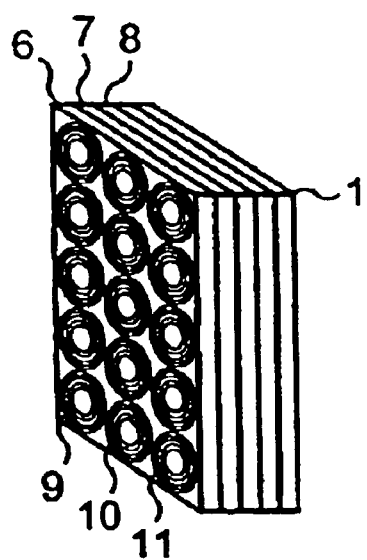
FIG. 5 is a perspective view (not to scale) of an alternative construction for the screen.

In the alternative embodiment shown in FIG. 5, layers of printed circuit board such as 6, 7, 8, are printed with ring or spiral capacitive elements such as 9, 10, 11 arranged in an array, as described. The elements line up with similar elements from other layers to form columns of elements, arranged with their axes normal to the plane of the screen.

The elements may include a switchable permittivity material, as described in co-pending United Kingdom Patent Application No. 0005356.1, to enable the magnetic permeability of the screen to be varied.

The screens have use in magnetic resonance apparatus as described in our co-pending United Kingdom Patent Application No. 0005354.6, but have many other applications as well. Other applications include the screening of the video line in the connection between the monitor and the processor in a PC, screening the clock chip in the same system, and shielding the IF stage in a sensitive radio receiver. At higher frequencies, these materials could be necessary to prevent the emissions from mobile phones from damaging the brain: a thin, light shield of the material could be interposed between the aerial and the skull.

EXAMPLE

Figure 3:
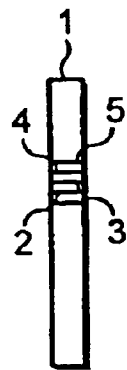
FIG. 3 is an end view of a screen.
Figure 4:
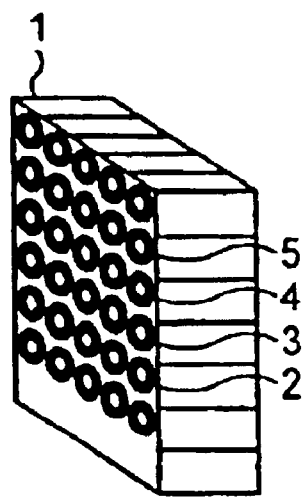
FIG. 4 is a perspective view (not to scale) of the screen shown in FIG. 3.

In one example of roll material such as is illustrated in FIGS. 3 and 4, the microstructured magnetic material consists of cylindrical elements, with each element being a "Swiss Roll". A switchable dielectric is incorporated between the layers, and this would reduce the resonant frequency so that the region with $\mu<0$, which lies above the resonant frequency, was now at the operating frequency.

For ProFilm (Mylar base coated with 10 nm of aluminium and a glue layer to give a total film of about 50 $\mu$m thickness, sheet resistance about 2.7 $\Omega$/square), 50 turns are wound on an 8 mm mandrel giving an outside diameter of 12.6 mm, a resonant frequency of 22.0 MHz, a plasma frequency of 72.2 MHz, and a most negative value of magnetic permeability of $\mu=-2.1$.

For Superinsulation (6.4 $\mu$m thick Mylar with 50 nm aluminium film; sheet resistance about 0.5 $\Omega$/square), 20 turns on a 6 mm mandrel gives an outside diameter of 6.26 mm, a resonant frequency of 20.3 MHz, a plasma frequency of 66.4 MHz, and a most negative permeability of $\mu=-3.28$.

With a 50 $\mu$m interlayer, 50 turns on a 6 mm mandrel gives an OD of 11.6 mm, resonant frequency of 37.5 MHz, plasma frequency of 122.8 MHz, and most negative permeability of $\mu=-19$.

Using a silver coated film to increase the conductivity (reduce the sheet resistance to 0.1 $\Omega$/square) in the previous example gives $\mu=-97.8$.

The materials (ProFilm and Superinsulation) may be assembled in hexagonal close packed lattices (i.e. as closely packed as possible).

Another example is provided by the double spiral structure referred to in co-pending patent application Ser. No. 0005356.1. Without dielectric paint of switchable permittivity, so the material is not switchable, it is found that a structure built up from double spiral elements, with 20 turns each, having a track width of 0.5 mm, gaps of 0.1 mm, internal diameter of 1 cm, outer diameter of 6 cm, based on 0.5 mm thick circuit board with $\epsilon=4.3$ gives a resonant frequency of 38.9 MHz, plasma frequency of 60.1 MHz, and a most negative permeability of $\mu=-2442$. The strongest shielding effects will occur close to the resonance frequency.

A further example of the use of spirals has the following set of dimensions:
   Number of turns=10
   Internal diameter=5 mm
   Outer diameter=18 mm
   Track width=0.5 mm; inter-track gap=0.1 mm
   Layer thickness=0.5 mm
   Fill the gaps with a switchable dielectric material (eg BST paint) with $\epsilon$=50, continuously switchable to $\epsilon$=20.
   The permeability at 21.3 MHz is shown below

| $\epsilon$ | $\mu$ | $\epsilon$ | $\mu$ | $\epsilon$ | $\mu$ |
|---|---|---|---|---|---|
| 50 | −1.57 + 0.01i | 46 | −101 + 15.7i | 40 | 2.42 + 0.003i |
| 49 | −2.33 + 0.016i | 45.9 | 280 + 531i | 20 | 1.16 + 10⁻⁵i |
| 48 | −3.82 + 0.034i | 45 | 11.4 + 0.16i | | |
| 47 | −8.03 + 0.121i | 44 | 5.85 + 0.035i | | |

So by controlling the permittivity of the dielectric in the gaps, the permeabilty can be controlled over the whole range of interesting values.

The design procedures for both guiding and shielding systems follow a similar approach. The first step is to define the frequency of interest. Then for guiding, we need to design the material so that the real part of the permeability is a maximum at that frequency. If reducing loss is particularly important, we would design the material so that the maximum in the real part of the permeability lay slightly above the frequency of interest, because the imaginary part (that gives rise to the loss) is falling faster than the real part in this frequency regime.

For shielding, there are two possible approaches. We can make the material so that the frequency of interest coincides with or lies slightly higher than the minimum (i.e. most negative) in the real part of the permeability. Alternatively, we can make the material so that the peak in the imaginary part of the permeability is at the frequency of interest. From a practical point of view, the former approach is preferred, although the latter may give slightly better performance.

Denoting $$\omega_0 = \sqrt{\frac{dc_0^2}{2\varepsilon\pi^2 r^3 (N-1)}} \quad \text{and} \quad \gamma = \frac{2\sigma}{r\mu_0(N-1)}$$

we can write the permeability as $$\mu = 1 - \frac{F}{1 - \left(\frac{\omega_0}{\omega}\right)^2 + i\frac{\gamma}{\omega}}$$

where F is the filling factor, and r is the effective radius of the mandrel, taking into account the finite thickness of the "Swiss Roll" and the other parameters are as described in the original patent.

The extrema of the real part of the permeability fall at $$\omega_{max} = \frac{1}{\omega_0 - \gamma}\sqrt{\omega_0(\omega_0 - \gamma)} \quad \text{and} \quad \omega_{min} = \frac{1}{\omega_0 + \gamma}\sqrt{\omega_0(\omega_0 + \gamma)}$$

for the maximum and minimum values respectively.

Given the material parameters d and $\sigma$, the permittivity of the film $\epsilon$, and the relationship between the effective radius and the core size, it is a simple matter to solve the above equations for the number of turns N that are required in the material. For example, using the material parameters of the first case described previously, we require N=32.5, and hence a resonant frequency of 23.4 MHz, to optimise the material for guiding. Better results would be provided by using the silver coated film as described previously: then to peak the real part of the permeability at 21.3 MHz requires 58.47 turns rather than the previous 58.62 turns, a difference in the total length of the film of 6 mm (in ~1680 mm).

To optimise for shielding rather than guiding, requires a determination of the number of turns that puts the most negative value of permeability at or just below the frequency of interest. For ProFilm (the first case), to optimise the shielding at 21.3 MHz, it is required that N=42.4 and a resonant frequency of 19.3 MHz. For the silver coated film described previously, N=58.77 turns would be needed, rather than 58.62 for resonance and 58.47 turns for guiding. The total length of film is increased by ~6 mm rather than decreased as for guiding.

What is claimed is:

1. A screen for radio frequency (r.f.) magnetic flux, comprising an array of capacitive elements, the array exhibiting a predetermined magnetic permeability in response to incident electromagnetic radiation lying within a predetermined frequency band, wherein each capacitive element includes a low resistance conducting path and is such that a magnetic component of the electromagnetic radiation lying within the predetermined frequency band induces an electrical current to flow around said path and through said associated element, wherein the spacing of the elements is less than the wavelength of the radiation within the predetermined frequency band, and wherein the size of the elements and their spacing apart is selected such as to provide a magnetic permeability having a zero or negative real part to electromagnetic radiation in the predetermined frequency band.

2. A screen as claimed in claim 1, in which the predetermined frequency band is within the high frequency (HF) band extending from 3 MHz to 30 MHz.

3. A screen as claimed in claim 1, in which the predetermined frequency band is within the range extending from approximately 19 MHz to approximately 39 MHz.

4. A screen as claimed in claim 1, in which the screen forms a planar structure.

5. A screen as claimed in claim 4, in which the capacitive elements are rolls of conducting material arranged with their axes normal to the local surface of the planar structure.

6. A screen as claimed in claim 4, in which the planar structure is formed by a plurality of layers, each layer bearing an array of planar rings or spirals.

7. A screen as claimed in claim 1, including a variable permittivity material associated with the capacitive elements to enable the magnetic permeability of the screen to be varied.

8. A screen as claimed in claim 1, in which the spacing of the elements is less than one half of the wavelength of the radiation within the predetermined frequency band.

9. A screen as claimed in claim 1, in which the spacing of the elements is less than one fifth of the wavelength of the radiation within the predetermined frequency band.

10. A screen as claimed in claim 1, in which the spacing of the elements is less than one tenth of the wavelength of the radiation within the predetermined frequency band.

11. A method of designing a screen for magnetic r.f. flux, which comprises selecting the dimensions of capacitive elements arranged in any array, the array exhibiting a predetermined magnetic permeability in response to incident electromagnetic radiation lying within a predetermined frequency band, in which capacitive elements currents can be induced by the radio frequency electromagnetic radiation, and selecting the spacing apart of the capacitive elements to be less than the wavelength of the radiation within the predetermined frequency band, and the size and spacing of the elements in order to provide a magnetic permeability for the screen in response to the electromagnetic radiation within the predetermined frequency band which has a zero or negative real part.

\* \* \* \* \*